United States Patent
Cheng

(10) Patent No.: US 10,026,834 B2
(45) Date of Patent: Jul. 17, 2018

(54) METHOD OF MANUFACTURING ENHANCED DEVICE AND ENHANCED DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 19 days.

(21) Appl. No.: 15/190,690

(22) Filed: Jun. 23, 2016

(65) Prior Publication Data

US 2016/0300941 A1    Oct. 13, 2016

Related U.S. Application Data

(63) Continuation of application No. PCT/CN2014/094757, filed on Dec. 24, 2014.

(30) Foreign Application Priority Data

Dec. 27, 2013  (CN) .......................... 2013 1 0738667

(51) Int. Cl.
*H01L 29/205*    (2006.01)
*H01L 29/778*    (2006.01)
(Continued)

(52) U.S. Cl.
CPC ...... *H01L 29/7787* (2013.01); *H01L 29/0657* (2013.01); *H01L 29/0692* (2013.01);
(Continued)

(58) Field of Classification Search
CPC ............. H01L 29/0657; H01L 29/0692; H01L 29/1037; H01L 29/2003; H01L 29/205;
(Continued)

(56) References Cited

U.S. PATENT DOCUMENTS 5,212,404 A * 5/1993 Awano ................ H01L 29/1029
257/14
7,052,942 B1 * 5/2006 Smart ............... H01L 29/66462
257/194
(Continued)

FOREIGN PATENT DOCUMENTS

CN     101252088 A        8/2008
CN     102130160    *    7/2011    ........... H01L 29/778
(Continued)

OTHER PUBLICATIONS

PCT International Search Report for PCT/CN2014/094757 (priority application), dated Mar. 10, 2015.
PCT Written Opinion for PCT/CN2014/094757 (priority application), dated Mar. 10, 2015.
SIPO Office Action for CN201310738667.7 (priority application), dated Nov. 3, 2015.
(Continued)

*Primary Examiner* — Joseph Galvin, III
(74) *Attorney, Agent, or Firm* — Flener IP & Business Law, LLC; Zareefa B. Flener

(57) ABSTRACT

A method of manufacturing an enhanced device and an enhance device are provided. The method comprises: preparing a substrate, and forming a non-planar structure in the substrate; depositing a nitride channel layer on the substrate, a gate region, a source region and a drain region being defined on the nitride channel layer, the gate region of the nitride channel layer having a non-planar structure transferred from the non-planar structure of the substrate; depositing a nitride barrier layer on the nitride channel layer, the nitride barrier layer having a non-planar structure located above and corresponding to the non-planar structure of the nitride channel layer, the nitride barrier layer and the nitride channel layer forming a nitride channel layer/nitride barrier layer heterojunction.

18 Claims, 16 Drawing Sheets

(51) Int. Cl.
*H01L 29/423* (2006.01)
*H01L 29/66* (2006.01)
*H01L 29/06* (2006.01)
*H01L 29/10* (2006.01)
*H01L 29/20* (2006.01)

(52) U.S. Cl.
CPC ...... *H01L 29/1037* (2013.01); *H01L 29/2003* (2013.01); *H01L 29/205* (2013.01); *H01L 29/4236* (2013.01); *H01L 29/66462* (2013.01); *H01L 29/7786* (2013.01); *H01L 29/7789* (2013.01)

(58) Field of Classification Search
CPC ........... H01L 29/4236; H01L 29/66462; H01L 29/7786; H01L 29/7787; H01L 29/7789
See application file for complete search history.

(56) References Cited

U.S. PATENT DOCUMENTS

2009/0008676 A1* 1/2009 Sato .................. H01L 29/42316
257/194
2009/0146185 A1* 6/2009 Suh .................... H01L 29/2003
257/194

FOREIGN PATENT DOCUMENTS

| CN | 102130160 A | 7/2011 |
| CN | 102856370 A | 1/2013 |

OTHER PUBLICATIONS

SIPO Office Action for CN201310738667.7 (priority application), dated Jul. 1, 2016.

* cited by examiner

METHOD OF MANUFACTURING ENHANCED DEVICE AND ENHANCED DEVICE

CROSS-REFERENCE TO RELATED APPLICATIONS

This application is a continuation of international application No. PCT/CN2014/094757 filed on Dec. 24, 2014, which claims the benefit and priority of Chinese patent application No. 201310738667.7 filed on Dec. 27, 2013. Both of these applications are incorporated herein in their entirety by reference.

TECHNICAL FIELD

The present invention relates to semiconductor technology, and more particularly to a method of manufacturing an enhanced device and an enhanced device manufactured by the method.

BACKGROUND

As the third-generation semiconductor material, gallium nitride has features of large band gap width, high electron saturation drift velocity, high breakdown field intensity, good thermal conductivity and so on. In view of electronic devices, gallium nitride material is more suitable for manufacturing semiconductor devices which can withstand high temperature, high frequency, high voltage and have high power compared with silicon and gallium arsenide.

Since strong two-dimensional electron gas exists in an AlGaN/GaN heterojunction structure, High Electron Mobility Transistors (HEMTs) using AlGaN/GaN heterojunction structures are depletion devices and are difficult to be used to implement enhanced devices. However, depletion devices have certain limitations in application in many cases, for example, they cannot be used as power switching devices which are required to be enhanced (normally-off) switching devices. Enhanced gallium nitride switching devices are mainly used for high-frequency devices, power switching devices and digital circuits, thus research on them is important.

In order to implement an enhanced gallium nitride switching device, it is necessary to find some ways to reduce concentration of carriers in a channel below a gate electrode in the case of zero gate voltage. One way is to use an etched structure at the gate electrode to locally decrease a thickness of an aluminum gallium nitride layer below the gate electrode, thereby controlling or reducing concentration of two-dimensional electron gas below the gate electrode. As shown in FIG. 1, a buffer layer 11, a gallium nitride layer 12 and an aluminum gallium nitride layer 13 are located on a substrate 10, a gate electrode 14, a source electrode 15 and a drain electrode 16 are located on the aluminum gallium nitride layer 13. Here, a portion of the aluminum gallium nitride layer below the gate electrode 14 is locally etched, so as to decrease a thickness of a portion of the aluminum gallium nitride layer in a gate region. Another way is to selectively remain p-type (Al)GaN below a gate electrode. The p-type (Al)GaN is used to increase conduction band energy level at an aluminum gallium nitride/gallium nitride heterojunction, so as to form a depletion region and thus implement an enhanced device. As shown in FIG. 2, local p-type nitrides 17 are selectively remained below a gate electrode 14'. Still another way is to utilize fluoride plasma processing technology. Negatively charged ions such as fluorine ions are injected into a barrier layer. Concentration of injected ions can be controlled to deplete two-dimensional electron gas in a conduction channel, and strong negative ions are required to pinch off the channel. As shown in FIG. 3, negatively charged ions 18 are injected into a barrier layer 13 below a gate electrode 14".

However, these ways have some shortcomings. In the first way, a threshold voltage is generally about 0-1 V which is less than a threshold voltage of 3-5 V for an application. In order to reach a high threshold voltage and a high operating voltage, it is required to form an additional dielectric layer, such as aluminum oxide deposited in an atomic layer, however, how to control an interface state between such a dielectric layer and an aluminum gallium nitride surface is a major problem unresolved. In the second way, it is necessary to selectively etch away all areas except for those below the gate electrode, how to precisely control an etching thickness is very challenging. In addition, defects caused by etching and magnesium atoms remaining in p-type aluminum gallium nitride will result in a severe current collapse effect. Furthermore, due to insufficient hole density (generally a density of holes in p-type gallium nitride is no more than $1E18/cm^3$), density of two-dimensional electron gas in an AlGaN/GaN heterojunction structure is greatly limited. If there is an excessively high density of electron in the two-dimensional electron gas, an enhanced device cannot be implemented, thus in the AlGaN/GaN heterojunction structure, content of aluminum is generally less than 20%, such as about 15%. In the third way, the fluoride plasma processing will destroy crystal structure, meanwhile, there is a poor processing repeat controllability, which has a large impact on stability and reliability of devices.

Therefore, in view of the above-mentioned technical problems and improvement methods, it is required to provide a new method of manufacturing an enhanced device.

SUMMARY

As discussed in the section of "Background", when using gallium nitride material in an enhanced device, it is required to control concentration of carriers in the channel in the case of zero gate voltage. However, in the prior art, no matter decreasing a thickness of a portion of the nitride barrier layer below the gate electrode, or remaining a layer of p-type nitrides below the gate electrode, or injecting negative ions into the barrier layer, the stability and reliability of devices are adversely affected by problems in the processes.

In view of this, the present invention discloses a method for manufacturing an enhanced device. The principle used to realize pinching off of the two-dimensional electron gas in the enhanced device is based on a characteristic of III group nitrides as a polar semiconductor. Referring to FIGS. 4 and 5, unlike traditional III-V group semiconductors, there are strong internal electric fields in the III group nitrides. If an AlInGaN/GaN heterojunction structure is formed at C(0002) plane, even without n-type doping in the AlInGaN layer, two-dimensional electron gas with very high concentration will be formed in the heterojunction. The reason lies in a spontaneous polarization electric field within the III group nitrides and a piezoelectric field caused by stresses. The concentration of the two-dimensional electron gas can be more than $1E13/cm^2$. However, the spontaneous polarization electric field and the piezoelectric field in the III group nitrides only exist in <0002> direction, rather than the polarity direction, i.e., the direction perpendicular to the <0002> direction. For example, there is no self-built electric field in <1-100>, <11-20>, etc. For semi-polar directions, for example, directions between the <0002> and the <1-100> or the <11-20>, the intensities of the internal electric field in these directions are far less than those in the <0002> direction.

Thus, in a gallium nitride heterojunction structure growing in a polarization direction, two-dimensional electron gas with very high concentration can be formed without intentional doping. However, for non-polar planes or semi-polar planes of gallium nitride material, since the polarization field intensity is almost zero or very low, two-dimensional electron gas will not be formed without doping. In this invention, by utilizing this feature of the gallium nitride material, grooves, protrusions or steps etc., are formed in a substrate and epitaxy parameters are controlled, so that the shape of the substrate is transferred to the channel layer, thus non-planar structures are formed in a gate region of the channel layer. By utilizing non-polar planes or semi-polar planes or a combination thereof of nitrides formed in the non-planar structures, two-dimensional electron gas is interrupted in the gate region, so that an enhanced device is implemented.

Since the shape of the substrate is transferred to the channel layer during manufacturing process of the enhanced device, a non-planar structure is formed in a gate region of the channel layer. Non-polar planes or semi-polar planes or combination thereof of nitrides formed in the non-planar structure will result in interruption of the two-dimensional electron gas, therefore, it is not necessary to etch the barrier layer, thereby avoiding performance deterioration due to damage to the active region, such as low current density or current collapse effect. Furthermore, it is no required to introduce Mg atoms to implement p-type nitrides, thereby avoiding contamination of the MOCVD or MBE chamber.

To achieve the above objects, embodiments of the present invention provide the following technical schemes as follows.

A method of manufacturing an enhanced device comprises:

S1. preparing a substrate, and forming a non-planar structure in the substrate;

S2. depositing a nitride channel layer on the substrate, a gate region, a source region and a drain region being defined on the nitride channel layer, the gate region of the nitride channel layer having a non-planar structure transferred from the non-planar structure of the substrate; and S3. depositing a nitride barrier layer on the nitride channel layer, the nitride barrier layer having a non-planar structure located above and corresponding to the non-planar structure of the nitride channel layer, the nitride barrier layer and the nitride channel layer forming a nitride channel layer/nitride barrier layer heterojunction.

The non-planar structure of the substrate, the non-planar structure of the nitride channel layer and the non-planar structure of the nitride barrier layer may be grooves or protrusions.

Cross-sectional shapes of the grooves or cross-sectional shapes of the protrusions may be one of rectangle, triangle, trapezoid, zigzag, polygon, semicircle, U-shape or any combination thereof.

The non-planar structure of the substrate and the non-planar structure of the nitride channel layer may have different cross-sectional shapes.

The non-planar structure of the substrate, the non-planar structure of the nitride channel layer and the non-planar structure of the nitride barrier layer may be steps.

Cross-sections of the steps may be vertical surfaces, or slope surfaces, or curved surfaces, or irregular surfaces.

After the step S1, the method may further comprise: depositing a nitride nucleation layer on the substrate, the nitride nucleation layer having a non-planar structure transferred from the non-planar structure of the substrate. The method may further comprises: depositing a nitride buffer layer on the nitride nucleation layer, the nitride buffer layer having a non-planar structure transferred from the non-planar structure of the substrate.

After the step S3, the method may further comprise: depositing a dielectric layer on the nitride barrier layer, the dielectric layer having a non-planar structure transferred from the non-planar structure of the substrate.

After the step S3, the method may further comprise: depositing a nitride capping layer on the nitride barrier layer.

After the step S2, the method may further comprise: depositing an aluminum nitride intermediate layer on the nitride channel layer.

After the step S3, the method may further comprise:

S4. forming a gate electrode, a source electrode and a drain electrode on the nitride barrier layer, the gate electrode, the source electrode and the drain electrode being located above the gate region, the source region and the drain region of the nitride channel layer respectively, the gate electrode being located between the source electrode and the drain electrode.

An enhanced device comprises: a substrate; a nitride channel layer located on the substrate, a gate region, a source region and a drain region being defined on the nitride channel layer; a nitride barrier layer located on the nitride channel layer, the nitride barrier layer and the nitride channel layer forming a nitride channel layer/nitride barrier layer heterojunction; wherein the substrate has a non-planar structure, the gate region of the nitride channel layer has a non-planar structure transferred from the non-planar structure of the substrate, the nitride barrier layer has a non-planar structure located above and corresponding to the non-planar structure of the nitride channel layer.

The non-planar structure of the substrate, the non-planar structure of the nitride channel layer and the non-planar structure of the nitride barrier layer may be grooves or protrusions.

Cross-sectional shapes of the grooves or cross-sectional shapes of the protrusions may be one of rectangle, triangle, trapezoid, zigzag, polygon, semicircle, U-shape or any combination thereof.

The non-planar structure of the substrate and the non-planar structure of the nitride channel layer may have different cross-sectional shapes.

The non-planar structure of the substrate, the non-planar structure of the nitride channel layer and the non-planar structure of the nitride barrier layer may be steps.

Cross-sections of the steps may be vertical surfaces, or slope surfaces, or curved surfaces, or irregular surfaces.

The enhanced device may further comprise a nitride nucleation layer having a non-planar structure transferred from the non-planar structure of the substrate between the substrate and the nitride channel layer.

The enhanced device may further comprise a nitride buffer layer having a non-planar structure transferred from the non-planar structure of the substrate on the nitride nucleation layer.

The enhanced device may further comprise a dielectric layer having a non-planar structure transferred from the non-planar structure of the substrate on the nitride barrier layer.

The enhanced device may further comprise a gate electrode, a source electrode and a drain electrode located on the nitride barrier layer, the gate electrode, the source electrode and the drain electrode being located above the gate region, the source region and the drain region of the nitride channel layer respectively, the gate electrode being located between the source electrode and the drain electrode.

In the manufacturing method of an enhanced device according to the present invention and the enhanced device manufactured by the method, it is not necessary to etch the nitride barrier layer, thereby avoiding performance deterioration due to damage to the active region, such as low current density or current collapse effect. Furthermore, it is no required to introduce Mg atoms to implement p-type nitrides, thereby avoiding contamination of the MOCVD or MBE chamber.

BRIEF DESCRIPTION OF DRAWINGS

In order to illustrate embodiments of the present invention or the prior art more clearly, hereinafter a simple introduction is made to the accompanying drawings used in the description of the embodiments or the prior art. It is obvious for those skilled in the art that the accompanying drawings just illustrate some embodiments of the present invention, and other accompanying drawings can be obtained based on the current accompanying drawings without inventive work. In the drawings:

FIGS. 6A-6G are schematic views illustrating a manufacturing process of an enhanced device according to a first embodiment of the present invention, wherein FIG. 6G is also a schematic view illustrating a structure of the enhanced device according to the first embodiment of the present invention;

FIGS. 7A-7G are schematic views illustrating a manufacturing process of an enhanced device according to a second embodiment of the present invention, wherein FIG. 7G is also a schematic view illustrating a structure of the enhanced device according to the second embodiment of the present invention;

FIGS. 8A-8G are schematic views illustrating a manufacturing process of an enhanced device according to a third embodiment of the present invention, wherein FIG. 8G is also a schematic view illustrating a structure of the enhanced device according to the third embodiment of the present invention;

FIGS. 9A-9G are schematic views illustrating a manufacturing process of an enhanced device according to a fourth embodiment of the present invention, wherein FIG. 9G is also a schematic view illustrating a structure of the enhanced device according to the fourth embodiment of the present invention;

DETAILED DESCRIPTION

Figure 1:
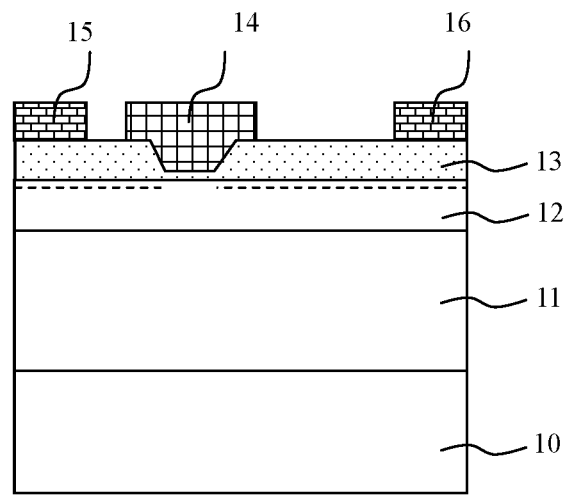
FIG. 1 is a schematic view illustrating a structure of an enhanced device in which concentration of two-dimensional electron gas below a gate electrode is controlled or reduced by decreasing a thickness of an aluminum gallium nitride layer below the gate electrode according to the prior art.
Figure 2:
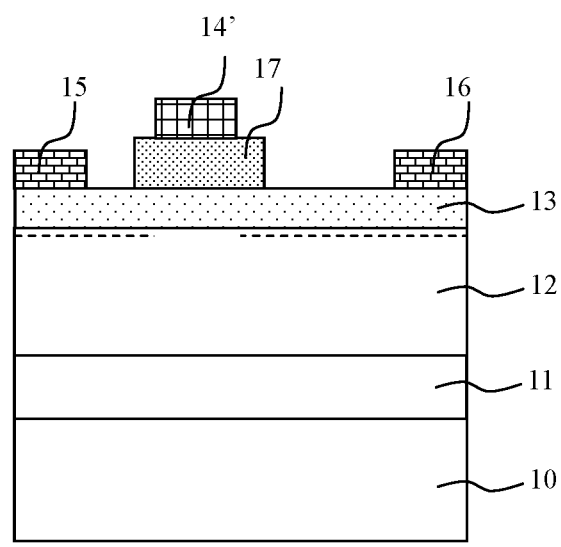
FIG. 2 is a schematic view illustrating a structure of an enhanced device in which p-type (Al)GaN below a gate electrode is selectively remained to increase conduction band energy level at an aluminum gallium nitride/gallium nitride heterojunction and thus form an enhanced device with a depletion region according to the prior art.
Figure 3:
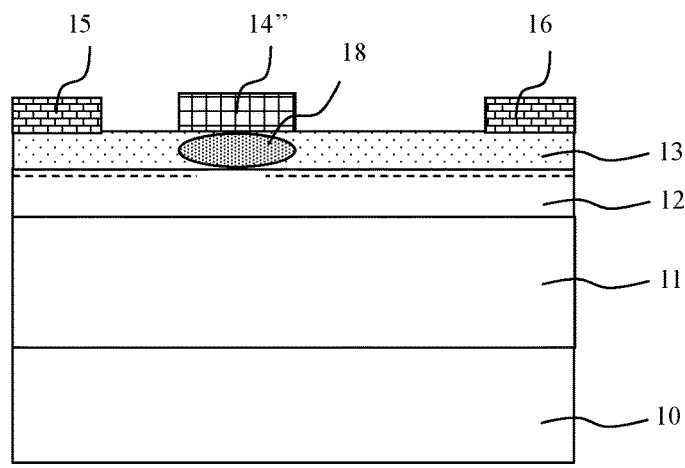
FIG. 3 is a schematic view illustrating a structure of an enhanced device in which fluoride plasma processing is utilized below a gate electrode according to the prior art.
Figure 4:
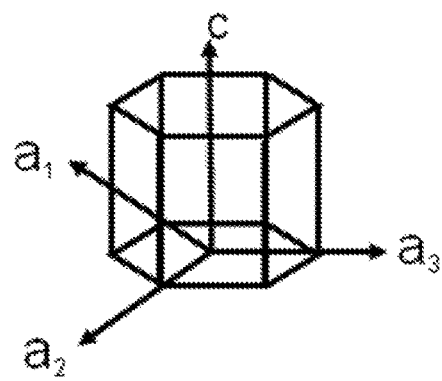
FIG. 4 is a schematic view illustrating a structure of a nitride lattice.
Figure 5:
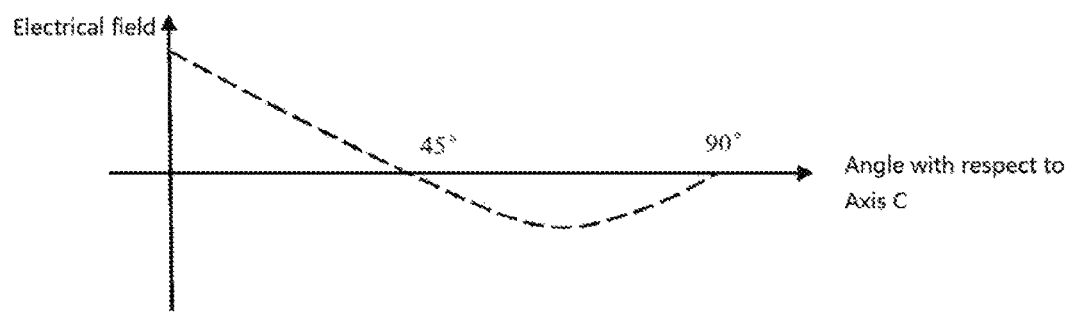
FIG. 5 is a schematic view illustrating distribution of a built-in electric field in different directions in nitrides.

The present invention will be described in detail hereinafter with reference to the specific embodiments in conjunction with the accompanying drawings. However, the present invention is not limited to the embodiments, rather, any modification of structures, methods or functions by those skilled in the art based on these embodiments is included within the scope of this invention.

In addition, like reference numerals may be used in different embodiments. Such a repeat is just for simple and clear description of the present invention, and does not imply that there is any correlation between the different embodiments and/or structures.

Figure 6A:
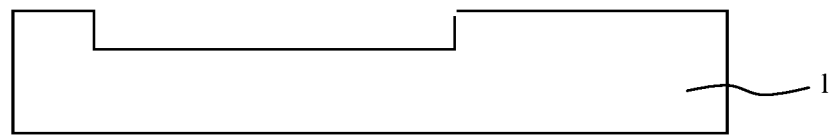
Figure 6B:
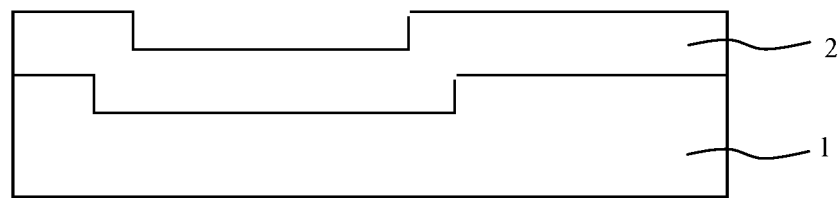
Figure 6C:
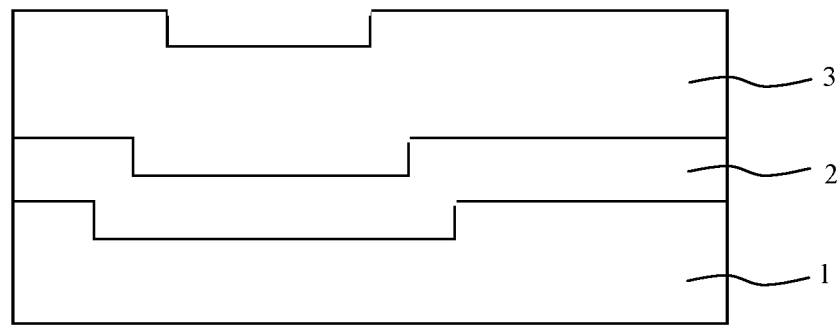
Figure 6D:
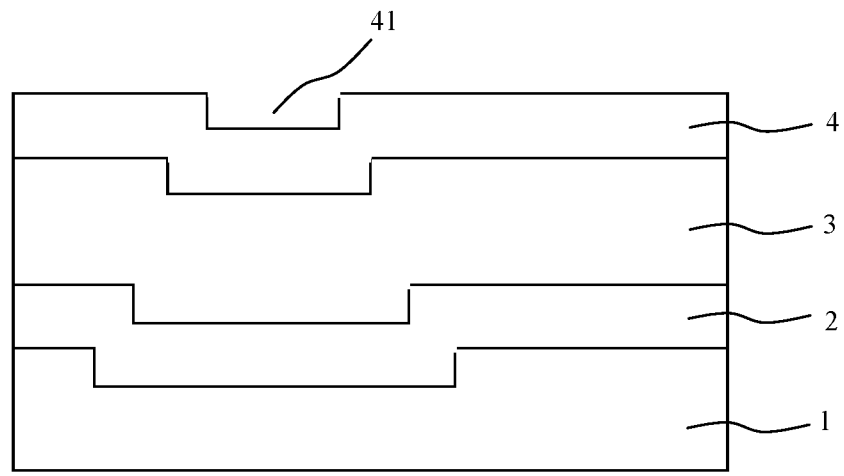
Figure 6E:
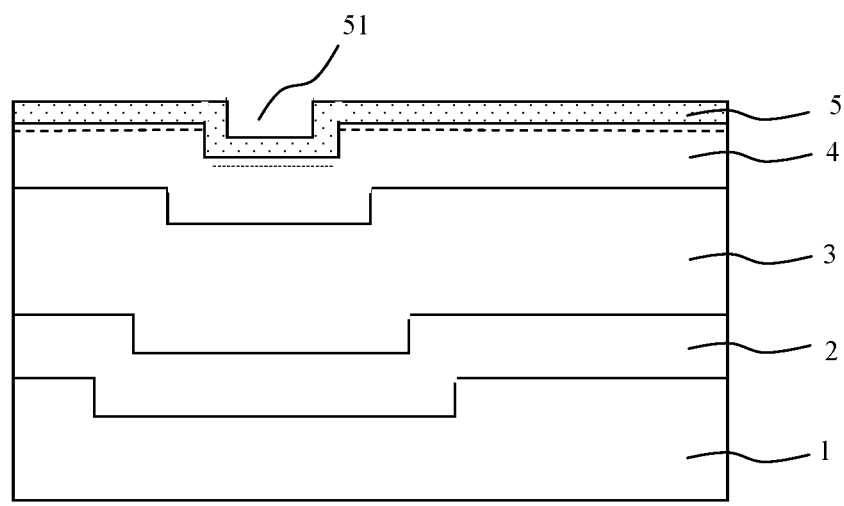
Figure 6F:
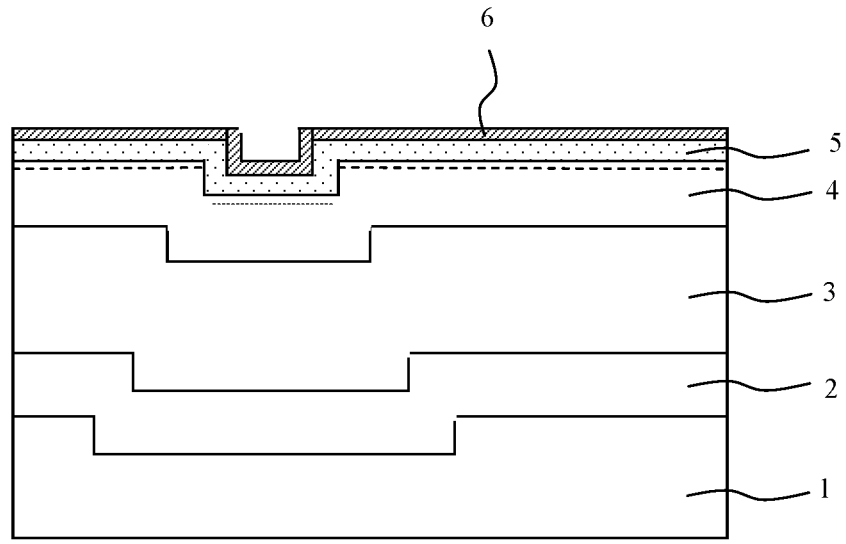
Figure 6G:
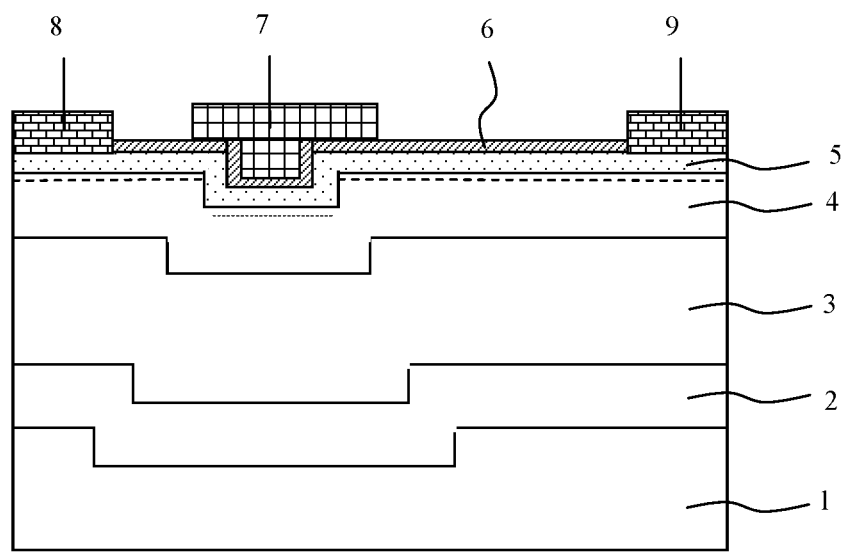

Referring to FIG. 6, FIGS. 6A-6G are schematic views illustrating a manufacturing process of an enhanced device according to a first embodiment of the present invention, wherein FIG. 6G is also a schematic view illustrating a structure of the enhanced device according to the first embodiment of the present invention.

As shown in FIG. 6G an enhanced device according to this embodiment comprises:

a substrate 1;

a nitride nucleation layer 2 located on the substrate 1;

a nitride buffer layer 3 located on the nitride nucleation layer 2;

a nitride channel layer 4 located on the nitride buffer layer 3;

a nitride barrier layer 5 located on the nitride channel layer 4, the nitride channel layer 4 and the nitride barrier layer 5 forming a nitride channel layer 4/nitride barrier layer 5 heterojunction;

a dielectric layer 6 located on the nitride barrier layer 5, the dielectric layer 6 being made of a material selected from a group consisting of SiN, SiCN, $SiO_2$, SiAlN, $Al_2O_3$, AlON, SiON, $HfO_2$, HfAlO or any combination thereof;

a gate electrode 7 located on the dielectric layer 6, a source electrode 8 and a drain electrode 9 located on the nitride barrier layer 5, the gate electrode 8 being located between the source electrode 8 and the drain electrode 9;

wherein the nitride channel layer 4 and the nitride barrier layer 5 respectively have at least one non-planar structure disposed in a region below the gate electrode, there are non-polar planes or semi-polar planes or combination thereof of nitrides at the non-planar structures, two-dimensional electron gas in a nitride channel layer 4/nitride barrier layer 5 heterojunction channel is at least partially interrupted in a region below the gate electrode.

In the present embodiment, each of the substrate 1, the nitride nucleation layer 2, the nitride buffer layer 3, the nitride channel layer 4, the nitride barrier layer 5 and the dielectric layer 6 has a non-planar structure, and all of the non-planar structures are provided as rectangular grooves.

Referring to FIGS. 6A-6Q a method of manufacturing an enhanced device according to this embodiment comprises the flowing steps.

(1) Referring to FIG. 6A, a substrate 1 is prepared and a rectangular groove is formed in the substrate 1. The substrate 1 may comprise a material of any of sapphire, silicon carbide, silicon, lithium niobate, SOI, gallium nitride and aluminum nitride and so on.

(2) Referring to FIG. 6B, a nitride nucleation layer 2, such as AlN and the like, is deposited on the substrate 1.

(3) Referring to FIG. 6C, a nitride buffer layer 3, such as AlGaN and the like, is deposited on the nitride nucleation layer 2.

(4) Referring to FIG. 6D, a nitride channel layer 4, such as GaN and the like, is deposited on the nitride buffer layer 3. The nitride channel layer 4 has a groove 41 transferred from the groove of the substrate, and the position of the groove 41 corresponds to a gate region defined on the epitaxial multilayer structure. According to a spontaneous polarization effect and a piezoelectric effect of III group nitride, a surface of the nitride channel layer 4 is in a polar plane, i.e., (0002) plane, while at least two side surfaces of the groove 41 have angles with respect to the surface of the nitride channel layer 4, that is, the side surfaces are located in non <0002> directions, such as (1-100) plane, (11-20) plane, (1-101) plane, (11-22) plane and the like.

(5) Referring to FIG. 6E, a nitride barrier layer 5 is deposited on the nitride channel layer 4. The nitride barrier layer 5 includes a groove 51 corresponding to the groove 41 in a portion of the nitride barrier layer 5 which is above the groove 41. Based on the above analysis, there are non-polar planes or semi-polar planes or combination thereof of nitrides at the grooves. As such, two-dimensional electron gas in a nitride channel layer 4/nitride barrier layer 5 heterojunction channel is interrupted in the gate region, thus concentration of carriers of the gate electrode can be controlled effectively when a gate voltage is zero.

(6) Referring to FIG. 6F, a dielectric layer 6 is deposited on the nitride barrier layer 5. The dielectric layer 6 may be made of a material selected from a group consisting of SiN, SiCN, $SiO_2$, SiAlN, $Al_2O_3$, AlON, SiON, $HfO_2$, HfAlO or any combination thereof. The dielectric layer 6 may function as a passivation layer.

(7) Referring to FIG. 6G a gate electrode 7 is formed in the gate region and on the dielectric layer 6. The gate electrode 6 may be formed at least partially in a channel so that the gate electrode 7 has a T-shaped structure. Usually, the gate electrode 7 is required to form an MIS or MOSFET structure together with the nitride barrier layer 5. A source electrode 8 and a drain electrode 9 are formed in a source region and a drain region respectively, and form ohmic contacts with the nitride barrier layer 5 respectively.

In the present embodiment, the groove 41 is a rectangular groove. In other embodiments, the groove 41 may have another shape, for example, a cross-sectional shape thereof may be one of triangle, trapezoid, zigzag, polygon, semicircle, U-shape or any combination thereof.

In the present embodiment, the nitride nucleation layer 2, the nitride buffer layer 3 and the dielectric layer 6 are optional, and in other embodiments, all or part of them may be omitted. Further, a nitride capping layer such as gallium nitride or aluminum gallium nitride may be grown on the nitride barrier layer; an aluminum nitride intermediate layer may be grown between the nitride barrier layer and the nitride channel layer.

Figure 7A:
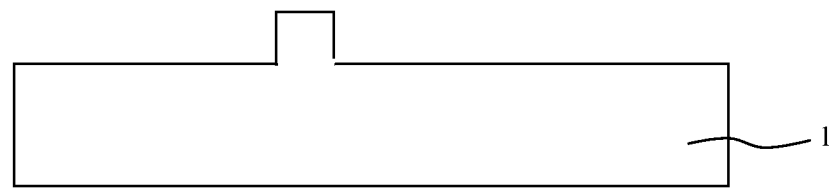
Figure 7B:
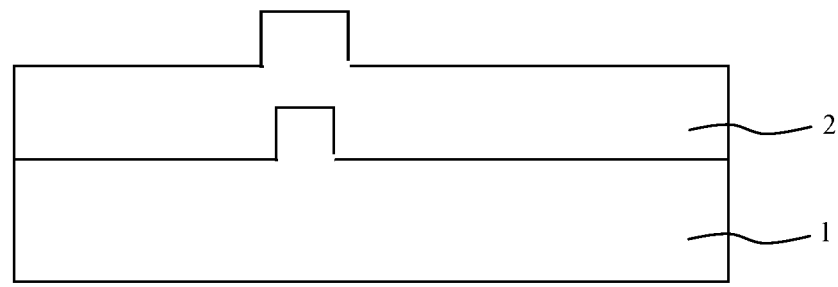
Figure 7C:
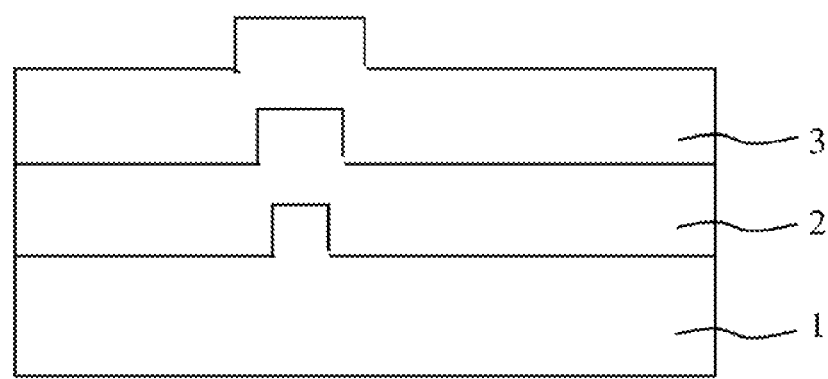
Figure 7D:
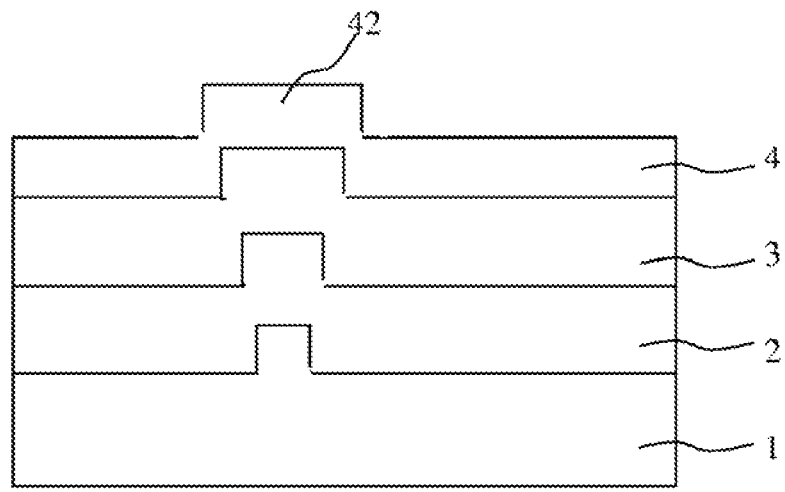
Figure 7E:
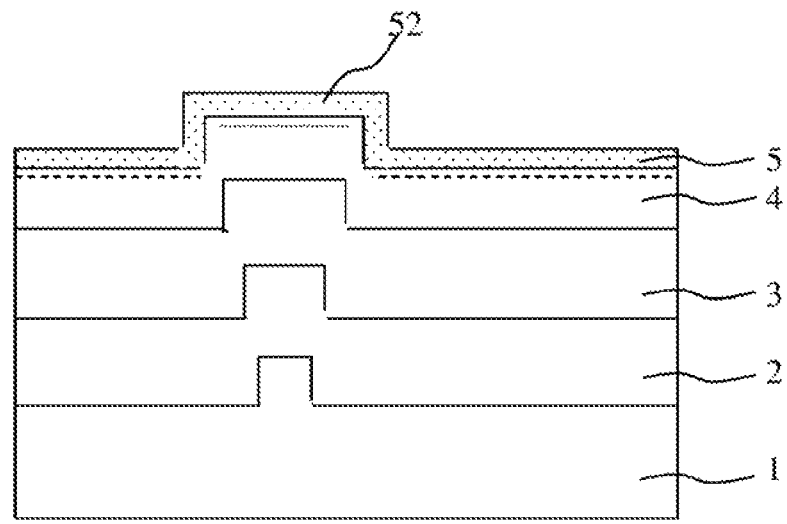
Figure 7F:
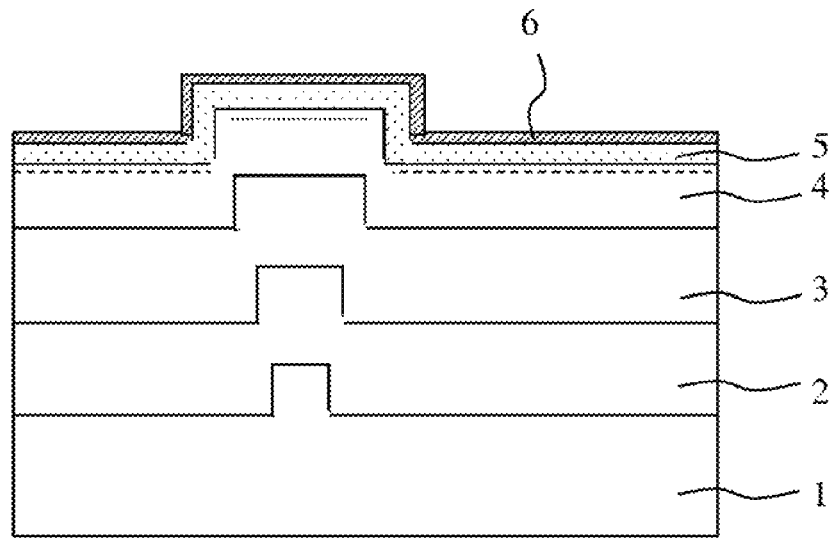
Figure 7G:
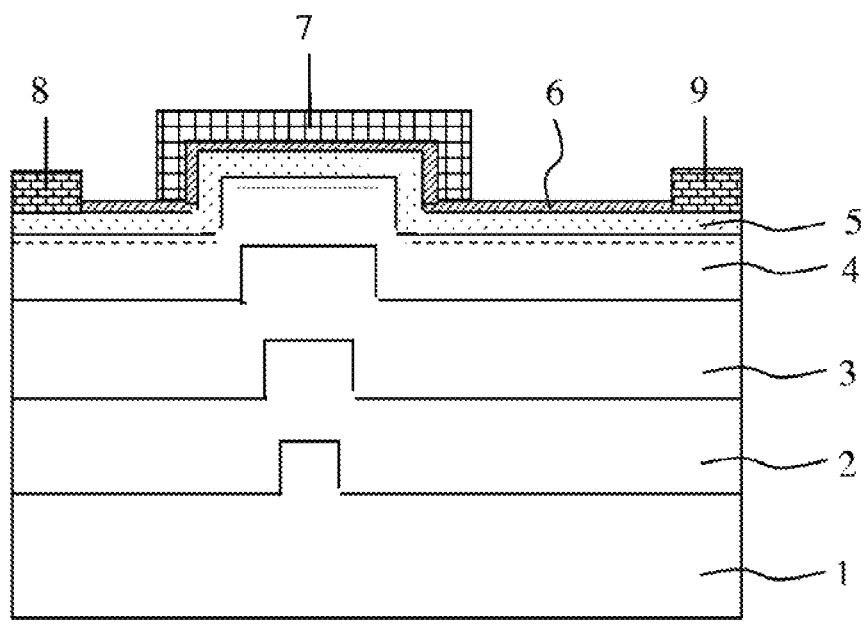

Referring to FIG. 7, FIGS. 7A-7G are schematic views illustrating a manufacturing process of an enhanced device according to a second embodiment of the present invention, wherein FIG. 7G is also a schematic view illustrating a structure of the enhanced device according to the second embodiment of the present invention.

As shown in FIG. 7G an enhanced device according to this embodiment comprises:
a substrate 1;
a nitride nucleation layer 2 located on the substrate 1;
a nitride buffer layer 3 located on the nitride nucleation layer 2;
a nitride channel layer 4 located on the nitride buffer layer 3;
a nitride barrier layer 5 located on the nitride channel layer 4, the nitride channel layer 4 and the nitride barrier layer 5 forming a nitride channel layer 4/nitride barrier layer 5 heterojunction;
a dielectric layer 6 located on the nitride barrier layer 5, the dielectric layer 6 being made of a material selected from a group consisting of SiN, SiCN, $SiO_2$, SiAlN, $Al_2O_3$, AlON, SiON, $HfO_2$, HfAlO or any combination thereof;
a gate electrode 7 located on the dielectric layer 6, a source electrode 8 and a drain electrode 9 located on the nitride barrier layer 5, the gate electrode 8 being located between the source electrode 8 and the drain electrode 9;
wherein the nitride channel layer 4 and the nitride barrier layer 5 respectively have at least one non-planar structure disposed in a region below the gate electrode, there are non-polar planes or semi-polar planes or combination thereof of nitrides at the non-planar structures, two-dimensional electron gas in a nitride channel layer 4/nitride barrier layer 5 heterojunction channel is at least partially interrupted in a region below the gate electrode.

In the present embodiment, each of the substrate 1, the nitride nucleation layer 2, the nitride buffer layer 3, the nitride channel layer 4, the nitride barrier layer 5 and the dielectric layer 6 has a non-planar structure, and all of the non-planar structures are provided as rectangular protrusions.

Referring to FIGS. 7A-7Q a method of manufacturing an enhanced device according to this embodiment comprises the flowing steps.

(1) Referring to FIG. 7A, a substrate 1 is prepared and a rectangular protrusion is formed in the substrate 1. The substrate 1 may comprise a material of any of sapphire, silicon carbide, silicon, lithium niobate, SOI, gallium nitride and aluminum nitride and so on.

(2) Referring to FIG. 7B, a nitride nucleation layer 2, such as AlN and the like, is deposited on the substrate 1.

(3) Referring to FIG. 7C, a nitride buffer layer 3, such as AlGaN and the like, is deposited on the nitride nucleation layer 2.

(4) Referring to FIG. 7D, a nitride channel layer 4, such as GaN and the like, is deposited on the nitride buffer layer 3. The nitride channel layer 4 has a protrusion 42 transferred from the protrusion of the substrate, and the position of the protrusion 42 corresponds to a gate region defined on the epitaxial multilayer structure. According to a spontaneous polarization effect and a piezoelectric effect of III group nitrides, a surface of the nitride channel layer 4 is in a polar plane, i.e., (0002) plane, while at least two side surfaces of the groove 41 have angles with respect to the surface of the nitride channel layer 4, that is, the side surfaces are located in non <0002> directions, such as (1-100) plane, (11-20) plane, (1-101) plane, (11-22) plane and the like.

(5) Referring to FIG. 7E, a nitride barrier layer 5 is deposited on the nitride channel layer 4. The nitride barrier layer 5 includes a protrusion 52 corresponding to the protrusion 42 in a portion of the nitride barrier layer 5 which is above the protrusion 42. Based on the above analysis, there are non-polar planes or semi-polar planes or combination thereof of nitrides at the protrusions. As such, two-dimensional electron gas in a nitride channel layer 4/nitride barrier layer 5 heterojunction channel is interrupted in the gate region, thus concentration of carriers of the gate electrode can be controlled effectively when a gate voltage is zero.

(6) Referring to FIG. 7F, a dielectric layer 6 is deposited on the nitride barrier layer 5. The dielectric layer 6 may be made of a material selected from a group consisting of SiN, SiCN, SiO$_2$, SiAlN, Al$_2$O$_3$, AlON, SiON, HfO$_2$, HfAlO or any combination thereof. The dielectric layer 6 may function as a passivation layer.

(7) Referring to FIG. 7G a gate electrode 7 is formed in the gate region and on the dielectric layer 6. The gate electrode 6 may be formed at least partially in a channel so that the gate electrode 7 has a T-shaped structure. Usually, the gate electrode 7 is required to form an MIS or MOSFET structure together with the nitride barrier layer 5. A source electrode 8 and a drain electrode 9 are formed in a source region and a drain region respectively, and form ohmic contacts with the nitride barrier layer 5 respectively.

In the present embodiment, the protrusion 42 is a rectangular protrusion. In other embodiments, the protrusion 42 may have another shape, for example, a cross-sectional shape thereof may be one of triangle, trapezoid, zigzag, polygon, semicircle, U-shape or any combination thereof.

In the present embodiment, the nitride nucleation layer 2, the nitride buffer layer 3 and the dielectric layer 6 are optional, and in other embodiments, all or part of them may be omitted. Further, a nitride capping layer such as gallium nitride or aluminum gallium nitride may be grown on the nitride barrier layer; an aluminum nitride intermediate layer may be grown between the nitride barrier layer and the nitride channel layer.

Figure 8A:
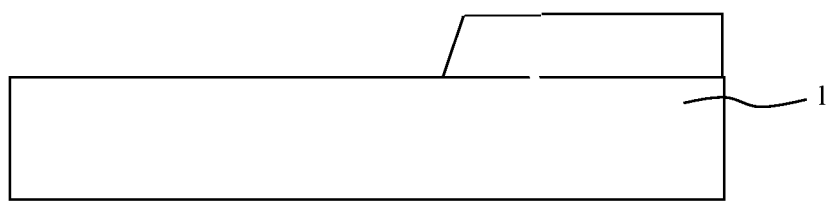
Figure 8B:
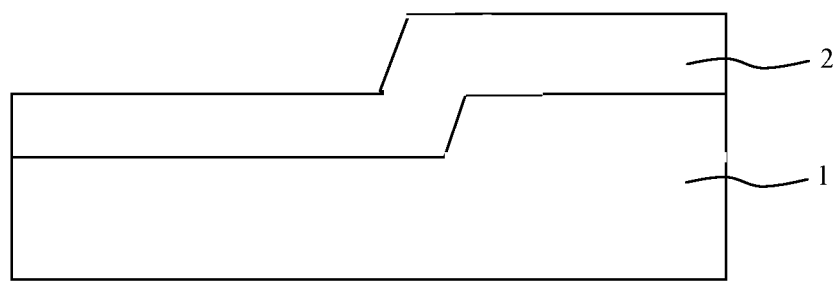
Figure 8C:
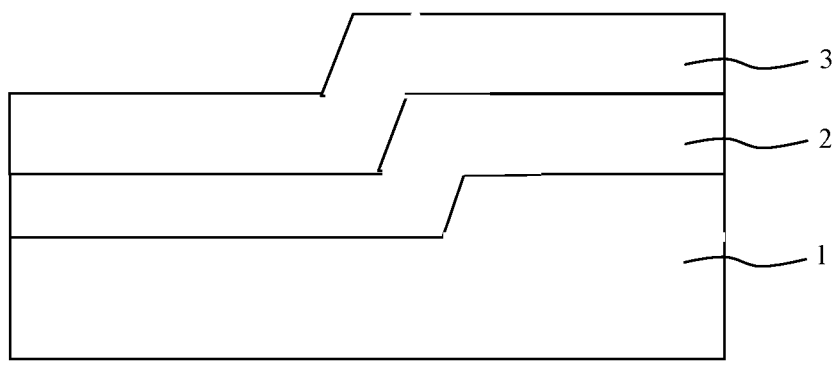
Figure 8D:
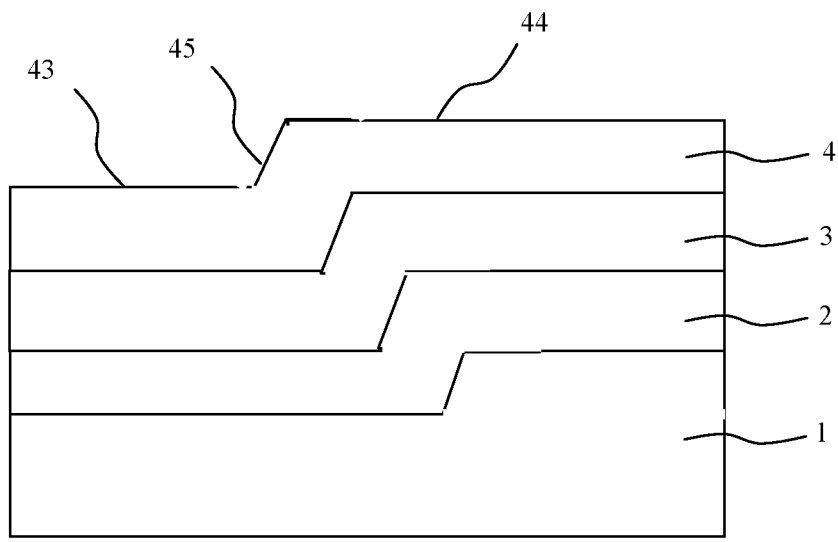
Figure 8E:
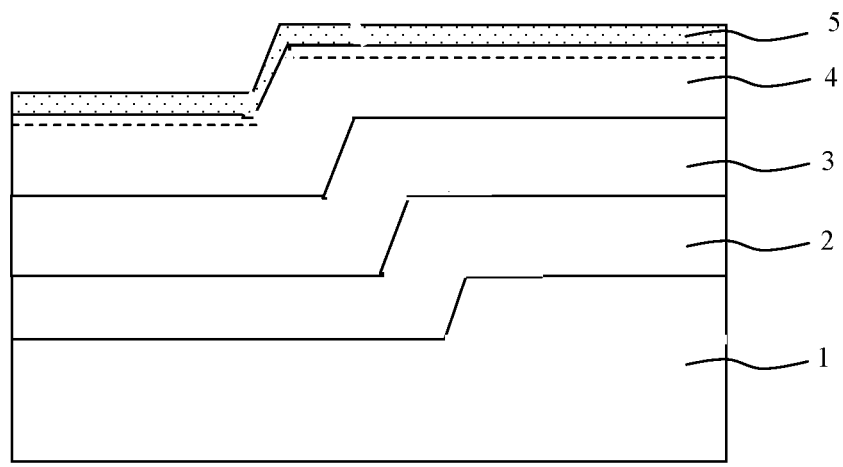
Figure 8F:
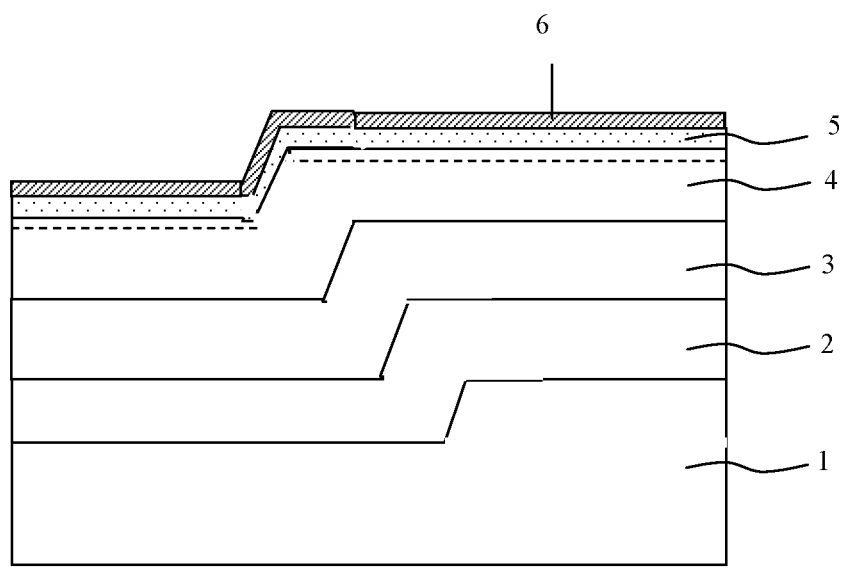
Figure 8G:
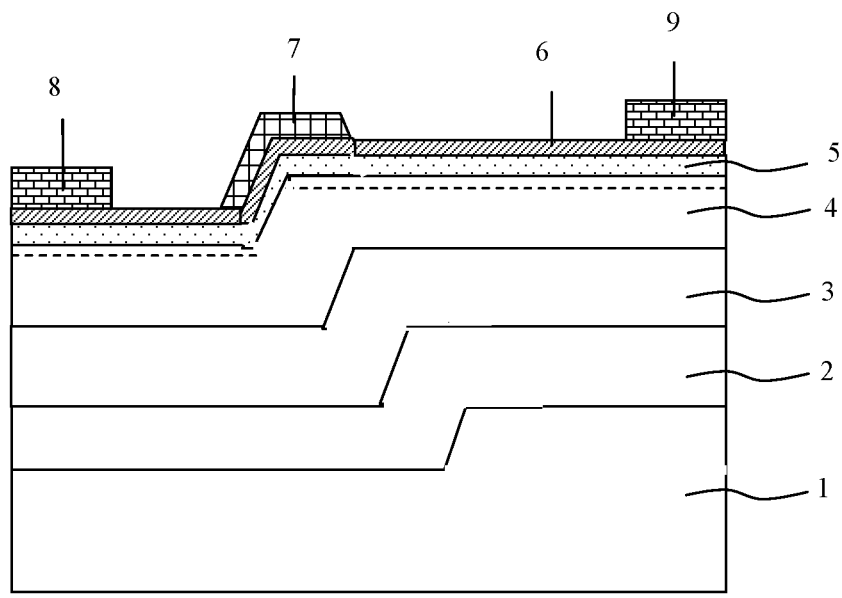

Referring to FIG. 8, FIGS. 8A-8G are schematic views illustrating a manufacturing process of an enhanced device according to a third embodiment of the present invention, wherein FIG. 8G is also a schematic view illustrating a structure of the enhanced device according to the third embodiment of the present invention.

As shown in FIG. 8G an enhanced device according to this embodiment comprises:
a substrate 1;
a nitride nucleation layer 2 located on the substrate 1;
a nitride buffer layer 3 located on the nitride nucleation layer 2;
a nitride channel layer 4 located on the nitride buffer layer 3;
a nitride barrier layer 5 located on the nitride channel layer 4, the nitride channel layer 4 and the nitride barrier layer 5 forming a nitride channel layer 4/nitride barrier layer 5 heterojunction;
a dielectric layer 6 located on the nitride barrier layer 5, the dielectric layer 6 being made of a material selected from a group consisting of SiN, SiCN, SiO$_2$, SiAlN, Al$_2$O$_3$, AlON, SiON, HfO$_2$, HfAlO or any combination thereof;
a gate electrode 7 located on the dielectric layer 6, a source electrode 8 and a drain electrode 9 located on the nitride barrier layer 5, the gate electrode 8 being located between the source electrode 8 and the drain electrode 9;
wherein the nitride channel layer 4 and the nitride barrier layer 5 respectively have at least one non-planar structure disposed in a region below the gate electrode, there are non-polar planes or semi-polar planes or combination thereof of nitrides at the non-planar structures, two-dimensional electron gas in a nitride channel layer 4/nitride barrier layer 5 heterojunction channel is at least partially interrupted in a region below the gate electrode.

In the present embodiment, each of the substrate 1, the nitride nucleation layer 2, the nitride buffer layer 3, the nitride channel layer 4, the nitride barrier layer 5 and the dielectric layer 6 has a non-planar structure, and all of the non-planar structures are provided as steps.

Referring to FIGS. 8A-8G a method of manufacturing an enhanced device according to this embodiment comprises the flowing steps.

(1) Referring to FIG. 8A, a substrate 1 is prepared and a step is formed in the substrate 1, that is, a step is formed on a surface of the substrate 1. The substrate may comprise a material of any of sapphire, silicon carbide, silicon, lithium niobate, SOI, gallium nitride and aluminum nitride and so on.

(2) Referring to FIG. 8B, a nitride nucleation layer 2, such as AlN and the like, is deposited on the substrate 1.

(3) Referring to FIG. 8C, a nitride buffer layer 3, such as AlGaN and the like, is deposited on the nitride nucleation layer 2.

(4) Referring to FIG. 8D, a nitride channel layer 4, such as GaN and the like, is deposited on the nitride buffer layer 3. The nitride channel layer 4 has a step transferred from the step of the substrate. The nitride channel layer 4 having the step includes a first surface 43 and a second surface 44 which have different heights and are connected by a connecting surface 45. In this embodiment, the connecting surface 45 is a slope having a certain angle.

(5) Referring to FIG. 8E, a nitride barrier layer 5 is deposited on the nitride channel layer 4. There are non-polar planes or semi-polar planes or combination thereof of nitrides at the steps. As such, two-dimensional electron gas in a nitride channel layer 4/nitride barrier layer 5 heterojunction channel is interrupted in the gate region, thus concentration of carriers of the gate electrode can be controlled effectively when a gate voltage is zero.

(6) Referring to FIG. 8F, a dielectric layer 6 is deposited on the nitride barrier layer 5. The dielectric layer 6 may be made of a material selected from a group consisting of SiN, SiCN, SiO$_2$, SiAlN, Al$_2$O$_3$, AlON, SiON, HfO$_2$, HfAlO or any combination thereof. The dielectric layer 6 may function as a passivation layer.

(7) Referring to FIG. 8G a gate electrode 7 is formed in the gate region and on the dielectric layer 6. The gate electrode 6 may be formed at least partially in a channel so that the gate electrode 7 has a T-shaped structure. Usually, the gate electrode 7 is required to form an MIS or MOSFET structure together with the nitride barrier layer 5. A source electrode 8 and a drain electrode 9 are formed in a source region and a drain region respectively, and form ohmic contacts with the nitride barrier layer 5 respectively.

In the present embodiment, the connecting surfaces of the steps are slopes having certain angles. In other embodiments, cross-sectional shapes of the steps may be other shapes, such as vertical surfaces, or curved surfaces, or irregular surfaces and so on.

In the present embodiment, the nitride nucleation layer 2, the nitride buffer layer 3 and the dielectric layer 6 are optional, and in other embodiments, all or part of them may be omitted. Further, a nitride capping layer such as gallium nitride or aluminum gallium nitride may be grown on the nitride barrier layer; an aluminum nitride intermediate layer may be grown between the nitride barrier layer and the nitride channel layer.

Figure 9A:
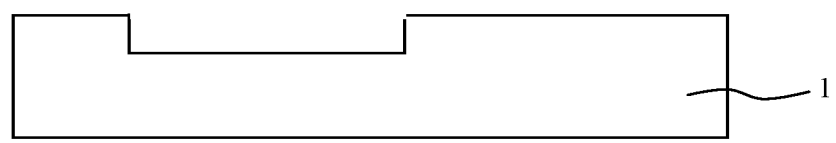
Figure 9B:
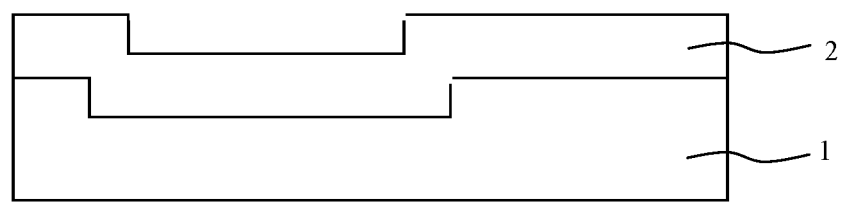
Figure 9C:
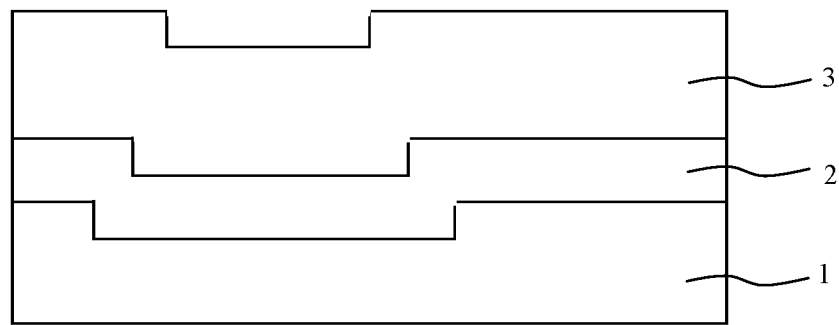
Figure 9D:
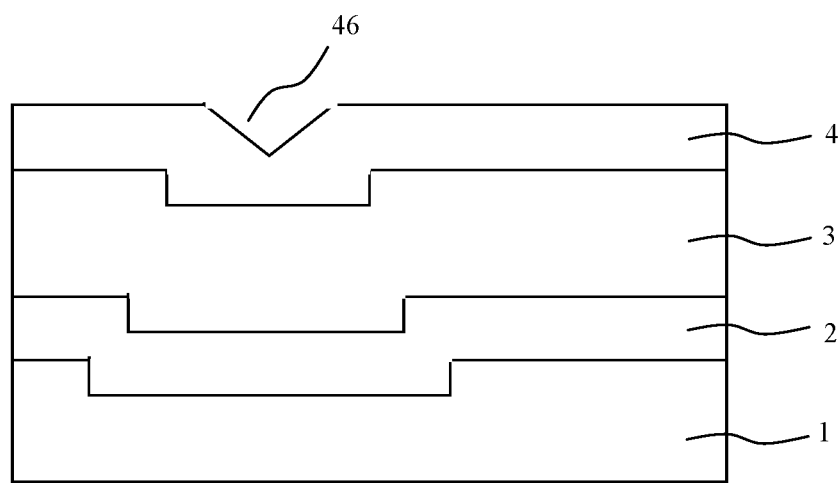
Figure 9E:
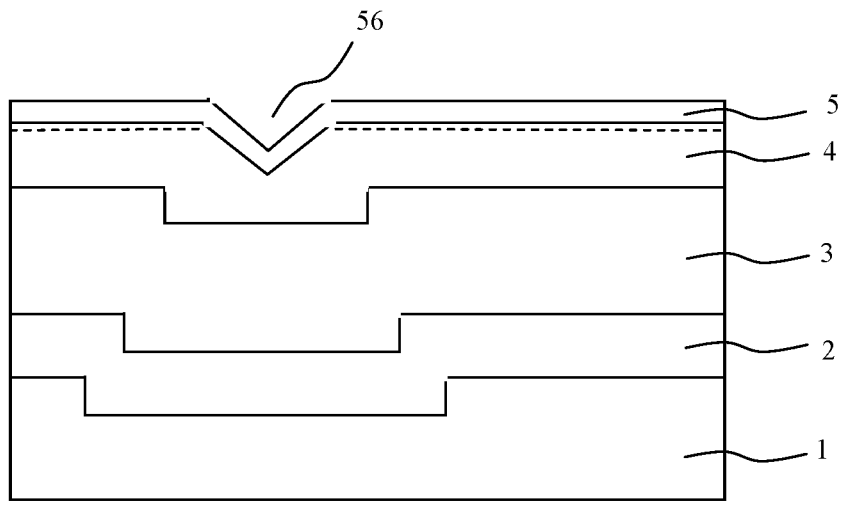
Figure 9F:
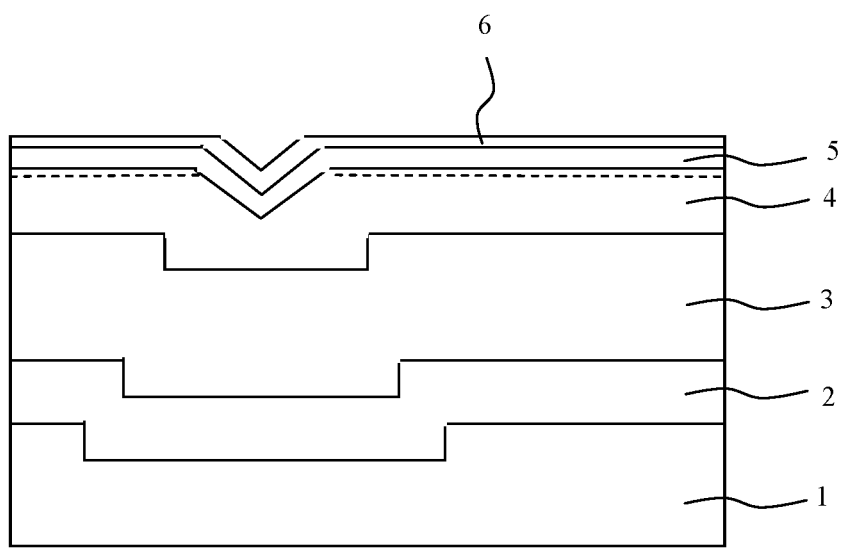
Figure 9G:
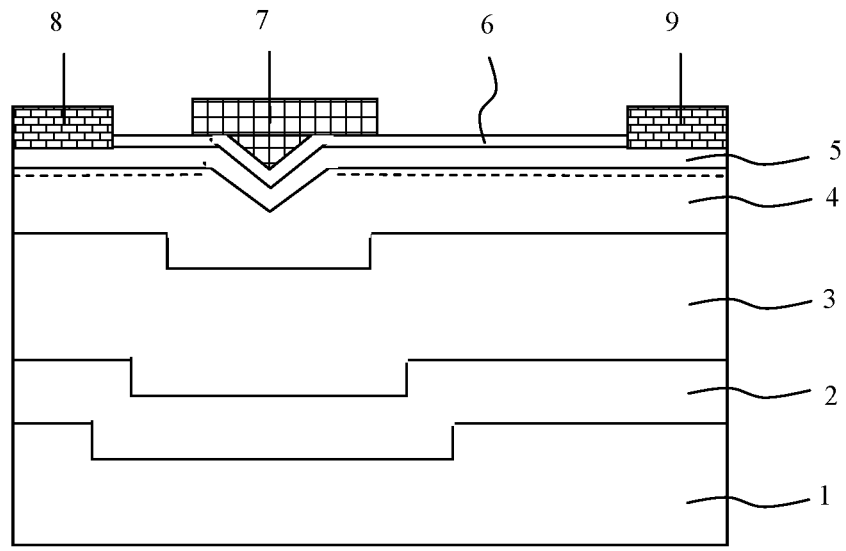

Referring to FIG. 9, FIGS. 9A-9G are schematic views illustrating a manufacturing process of an enhanced device according to a fourth embodiment of the present invention, wherein FIG. 9G is also a schematic view illustrating a structure of the enhanced device according to the fourth embodiment of the present invention.

As shown in FIG. 9G an enhanced device according to this embodiment comprises:

a substrate 1;

a nitride nucleation layer 2 located on the substrate 1;

a nitride buffer layer 3 located on the nitride nucleation layer 2;

a nitride channel layer 4 located on the nitride buffer layer 3;

a nitride barrier layer 5 located on the nitride channel layer 4, the nitride channel layer 4 and the nitride barrier layer 5 forming a nitride channel layer 4/nitride barrier layer 5 heterojunction;

a dielectric layer 6 located on the nitride barrier layer 5, the dielectric layer 6 being made of a material selected from a group consisting of SiN, SiCN, $SiO_2$, SiAlN, $Al_2O_3$, AlON, SiON, $HfO_2$, HfAlO or any combination thereof;

a gate electrode 7 located on the dielectric layer 6, a source electrode 8 and a drain electrode 9 located on the nitride barrier layer 5, the gate electrode 8 being located between the source electrode 8 and the drain electrode 9;

wherein the nitride channel layer 4 and the nitride barrier layer 5 respectively have at least one non-planar structure disposed in a region below the gate electrode, there are non-polar planes or semi-polar planes or combination thereof of nitrides at the non-planar structures, two-dimensional electron gas in a nitride channel layer 4/nitride barrier layer 5 heterojunction channel is at least partially interrupted in a region below the gate electrode.

In the present embodiment, each of the substrate 1, the nitride nucleation layer 2, the nitride buffer layer 3, the nitride channel layer 4, the nitride barrier layer 5 and the dielectric layer 6 has a non-planar structure. The non-planar structures of the substrate 1, the nitride nucleation layer 2 and the nitride buffer layer 3 are provided as rectangular grooves, while the non-planar structures of the nitride channel 4, the nitride barrier layer 5 and the dielectric layer 6 are provided as triangular grooves.

Referring to FIGS. 9A-9G a method of manufacturing an enhanced device according to this embodiment comprises the flowing steps.

(1) Referring to FIG. 9A, a substrate 1 is prepared and a rectangular groove is formed in the substrate 1. The substrate 1 may comprise a material of any of sapphire, silicon carbide, silicon, lithium niobate, SOI, gallium nitride and aluminum nitride and so on.

(2) Referring to FIG. 9B, a nitride nucleation layer 2, such as AlN and the like, is deposited on the substrate 1. The nitride nucleation layer 2 has a groove transferred from the groove of the substrate.

(3) Referring to FIG. 9C, a nitride buffer layer 3, such as AlGaN and the like, is deposited on the nitride nucleation layer 2. The nitride buffer layer 3 has a groove transferred from the groove of the substrate.

(4) Referring to FIG. 9D, a nitride channel layer 4, such as GaN and the like, is deposited on the nitride buffer layer 3. The nitride channel layer 4 has a groove 46 transferred from the groove of the substrate, and the groove 46 has a triangular shape. A method of forming the groove 46 through transferring is controlling conditions of growth so as to transform the rectangular groove of the nitride buffer layer 3 into the triangular groove 46 in the nitride channel layer 4 during the growth. The position of the groove 46 corresponds to a gate region defined on the epitaxial multilayer structure. According to a spontaneous polarization effect and a piezoelectric effect of III group nitrides, a surface of the nitride channel layer 4 is in a polar plane, i.e., (0002) plane, while at least two side surfaces of the groove 46 have angles with respect to the surface of the nitride channel layer 4, that is, the side surfaces are located in non <0002> directions, such as (1-100) plane, (11-20) plane, (1-101) plane, (11-22) plane and the like.

(5) Referring to FIG. 9E, a nitride barrier layer 5 is deposited on the nitride channel layer 4. The nitride barrier layer 5 includes a groove 56 corresponding to the groove 46 in a portion of the nitride barrier layer 5 which is above the groove 46. Based on the above analysis, there are non-polar planes or semi-polar planes or combination thereof of nitrides at the grooves. As such, two-dimensional electron gas in a nitride channel layer 4/nitride barrier layer 5 heterojunction channel is interrupted in the gate region, thus concentration of carriers of the gate electrode can be controlled effectively when a gate voltage is zero.

(6) Referring to FIG. 9F, a dielectric layer 6 is deposited on the nitride barrier layer 5. The dielectric layer 6 may be made of a material selected from a group consisting of SiN, SiCN, $SiO_2$, SiAlN, $Al_2O_3$, AlON, SiON, $HfO_2$, HfAlO or any combination thereof. The dielectric layer 6 may function as a passivation layer.

(7) Referring to FIG. 9G; a gate electrode 7 is formed in the gate region and on the dielectric layer 6. The gate electrode 6 may be formed at least partially in a channel so that the gate electrode 7 has a T-shaped structure. Usually, the gate electrode 7 is required to form an MIS or MOSFET structure together with the nitride barrier layer 5. A source electrode 8 and a drain electrode 9 are formed in a source region and a drain region respectively, and form ohmic contacts with the nitride barrier layer 5 respectively.

In the present embodiment, the groove 46 is a triangular groove. In other embodiments, the groove 46 may have another shape, for example, a cross-sectional shape thereof may be one of rectangle, trapezoid, zigzag, polygon, semicircle, U-shape or any combination thereof.

In the present embodiment, the nitride nucleation layer 2, the nitride buffer layer 3 and the dielectric layer 6 are optional, and in other embodiments, all or part of them may be omitted. Further, a nitride capping layer such as gallium nitride or aluminum gallium nitride may be grown on the nitride barrier layer; an aluminum nitride intermediate layer may be grown between the nitride barrier layer and the nitride channel layer.

Figure 10:
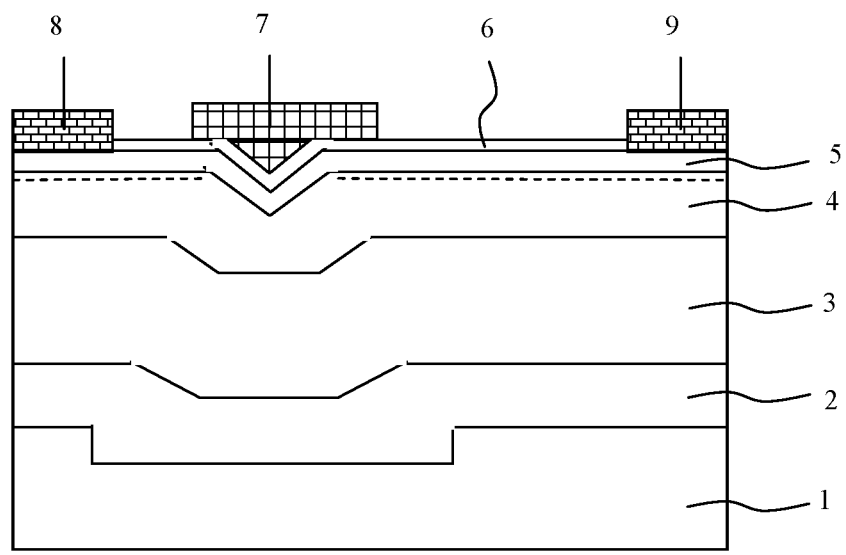
FIG. 10 is a schematic view illustrating a structure of an enhanced device according to a fifth embodiment of the present invention.

Referring to FIG. 10, FIG. 10 is a schematic view illustrating a structure of an enhanced device according to a fifth embodiment of the present invention. In the present embodiment, a groove of the substrate 1 has a rectangular shape, grooves of a nitride nucleation layer 2 and a nitride buffer layer 3 have trapezoidal shapes, and grooves of a nitride channel layer 4, a nitride barrier layer 5 and a dielectric layer 6 have triangular shapes. Other aspects of this embodiment are the same as those of the first embodiment.

Figure 11:
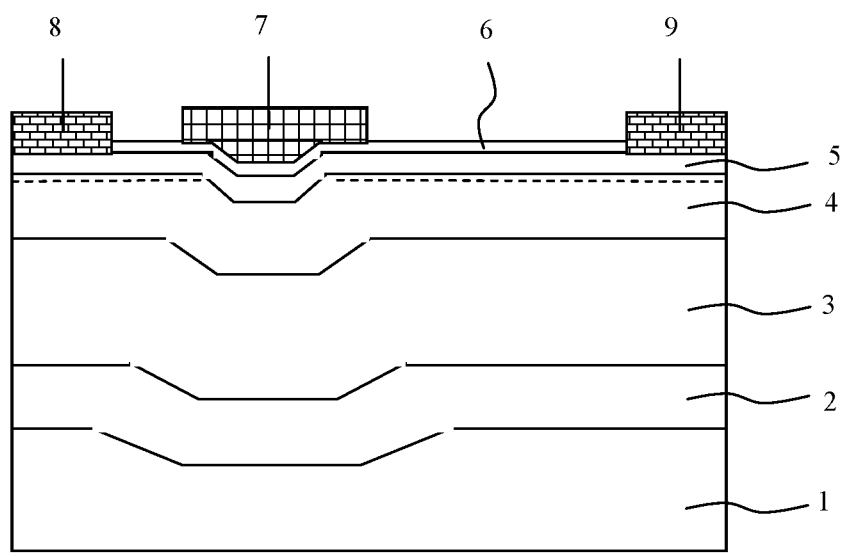
FIG. 11 is a schematic view illustrating a structure of an enhanced device according to a sixth embodiment of the present invention.

Referring to FIG. 11, FIG. 11 is a schematic view illustrating a structure of an enhanced device according to a sixth embodiment of the present invention. In the present embodiment, a groove of the substrate 1 has a trapezoidal shape, grooves of a nitride nucleation layer 2, a nitride buffer layer 3, a nitride channel layer 4, a nitride barrier layer 5 and a dielectric layer 6 have trapezoidal shapes. Other aspects of this embodiment are the same as those of the first embodiment.

As can be seen from the above technical solutions, the present invention provides a method for manufacturing an enhanced device. Since the shape of the substrate is transferred to the nitride channel layer during manufacturing process of the enhanced device, a non-planar structure is formed in a gate region of the nitride channel layer. Nonpolar planes, or semi-polar planes or combination thereof of nitrides formed in the non-planar structure will result in interruption of the two-dimensional electron gas, therefore, it is not necessary to etch the nitride barrier layer, thereby avoiding performance deterioration due to damage to the active region, such as low current density or current collapse effect. Furthermore, it is no required to introduce Mg atoms to implement p-type nitrides, thereby avoiding contamination of the MOCVD or MBE chamber.

It will be understood by those skilled in the art that the present invention is not limited to the exemplary embodiments, rather, this invention may be realized in other specific forms without departing from the spirit or features of the present invention. Therefore, the embodiments should be considered as exemplary, not limitative. The scope of the present invention is defined by the appended claims rather than the foregoing description. This invention is intended to cover all modifications included within the spirit and scope of the appended claims and the equivalent arrangements. Any reference numeral in the claims should not be considered as limitation to the claims.

Further, it will be understood that although various embodiments are described in the specification, it does not mean that each embodiment contains only one separate technical scheme. This description manner is just for clarity, the specification should be considered as a whole by those skilled in the art. The technical schemes in various embodiments may be combined to form other embodiments understood by those skilled in the art.

What is claimed is:

1. A method of manufacturing an III group nitride enhanced device, comprising:
    preparing a substrate, and forming a non-planar structure in the substrate;
    depositing a nitride channel layer on the substrate, a gate region, a source region and a drain region being defined on the nitride channel layer, the gate region of the nitride channel layer having a non-planar structure which is, by controlling conditions of growth, transferred from the non-planar structure of the substrate so that the non-planar structure of the substrate and the non-planar structure of the nitride channel layer have different cross-sectional shapes, and the nitride channel layer being a III group nitride channel layer; and
    depositing a nitride barrier layer on the nitride channel layer, the nitride barrier layer having a non-planar structure located above and corresponding to the non-planar structure of the nitride channel layer, the nitride barrier layer being a III group nitride barrier layer, the nitride barrier layer and the nitride channel layer forming a nitride channel layer/nitride barrier layer heterojunction;
    wherein the non-planar structure of the substrate has a rectangular cross-sectional shape, the non-planar structure of the nitride channel layer has a trapezoidal cross-sectional shape, and the non-planar structure of the nitride barrier layer has a triangular cross-sectional shape; and
    the substrate comprises the material of silicon.

2. The method according to claim 1, wherein the non-planar structure of the substrate, the non-planar structure of the nitride channel layer and the non-planar structure of the nitride barrier layer are grooves or protrusions.

3. The method according to claim 2, wherein cross-sectional shapes of the grooves or cross-sectional shapes of the protrusions are one of rectangle, triangle, trapezoid, zigzag, polygon, semicircle, U-shape or any combination thereof.

4. The method according to claim 1, wherein the non-planar structure of the substrate, the non-planar structure of the nitride channel layer and the non-planar structure of the nitride barrier layer are steps.

5. The method according to claim 4, wherein cross-sections of the steps are vertical surfaces, or slope surfaces, or curved surfaces, or irregular surfaces.

6. The method according claim 1, after preparing a substrate and forming a non-planar structure in the substrate, further comprising: depositing a nitride nucleation layer on the substrate, the nitride nucleation layer having a non-planar structure transferred from the non-planar structure of the substrate.

7. The method according to claim 6, further comprising depositing a nitride buffer layer on the nitride nucleation layer, the nitride buffer layer having a non-planar structure transferred from the non-planar structure of the substrate.

8. The method according to claim 1, after depositing a nitride barrier layer on the nitride channel layer, further comprising: depositing a dielectric layer on the nitride barrier layer, the dielectric layer having a non-planar structure transferred from the non-planar structure of the substrate.

9. The method according to claim 1, after depositing a nitride barrier layer on the nitride channel layer, further comprising:
    forming a gate electrode, a source electrode and a drain electrode on the nitride barrier layer, the gate electrode, the source electrode and the drain electrode being located above the gate region, the source region and the drain region of the nitride channel layer respectively, the gate electrode being located between the source electrode and the drain electrode.

10. An III group nitride enhanced device, comprising:
    a substrate;
    a nitride channel layer located on the substrate, a gate region, a source region and a drain region being defined on the nitride channel layer, the nitride channel layer being a III group nitride channel layer; and
    a nitride barrier layer located on the nitride channel layer, the nitride barrier layer being a III group nitride barrier layer, the nitride barrier layer and the nitride channel layer forming a nitride channel layer/nitride barrier layer heterojunction;
    wherein the substrate has a non-planar structure, the gate region of the nitride channel layer has a non-planar structure which is, by controlling conditions of growth, transferred from the non-planar structure of the substrate so that the non-planar structure of the substrate and the non-planar structure of the nitride channel layer have different cross-sectional shapes, the nitride barrier layer has a non-planar structure located above and corresponding to the non-planar structure of the nitride channel layer;
    wherein the non-planar structure of the substrate has a rectangular cross-sectional shape, the non-planar structure of the nitride channel layer has a trapezoidal cross-sectional shape, and the non-planar structure of the nitride barrier layer has a triangular cross-sectional shape; and
    the substrate comprises the material of silicon.

11. The enhanced device according to claim 10, wherein the non-planar structure of the substrate, the non-planar structure of the nitride channel layer and the non-planar structure of the nitride barrier layer are grooves or protrusions.

12. The enhanced device according to claim 11, wherein cross-sectional shapes of the grooves or cross-sectional shapes of the protrusions are one of rectangle, triangle, trapezoid, zigzag, polygon, semicircle, U-shape or any combination thereof.

13. The enhanced device according to claim 10, wherein the non-planar structure of the substrate, the non-planar structure of the nitride channel layer and the non-planar structure of the nitride barrier layer are steps.

14. The enhanced device according to claim 13, wherein cross-sections of the steps are vertical surfaces, or slope surfaces, or curved surfaces, or irregular surfaces.

15. The enhanced device according to claim 10, further comprising a nitride nucleation layer having a non-planar structure transferred from the non-planar structure of the substrate between the substrate and the nitride channel layer.

16. The enhanced device according to claim 15, further comprising a nitride buffer layer having a non-planar structure transferred from the non-planar structure of the substrate on the nitride nucleation layer.

17. The enhanced device according to claim 10, further comprising a dielectric layer having a non-planar structure transferred from the non-planar structure of the substrate on the nitride barrier layer.

18. The enhanced device according to claim 10, further comprising a gate electrode, a source electrode and a drain electrode located on the nitride barrier layer, the gate electrode, the source electrode and the drain electrode being located above the gate region, the source region and the drain region of the nitride channel layer respectively, the gate electrode being located between the source electrode and the drain electrode.

* * * * *